US007340712B2

(12) United States Patent
Correale, Jr.

(10) Patent No.: US 7,340,712 B2
(45) Date of Patent: Mar. 4, 2008

(54) SYSTEM AND METHOD FOR CREATING A STANDARD CELL LIBRARY FOR REDUCED LEAKAGE AND IMPROVED PERFORMANCE

(75) Inventor: Anthony Correale, Jr., Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 344 days.

(21) Appl. No.: 11/142,566

(22) Filed: Jun. 1, 2005

(65) Prior Publication Data

US 2006/0273821 A1 Dec. 7, 2006

(51) Int. Cl.
*G06F 17/50* (2006.01)
(52) U.S. Cl. .................. 716/17; 716/1; 716/5
(58) Field of Classification Search .......... 716/1, 716/5, 17; 326/31, 35, 36
See application file for complete search history.

(56) References Cited

U.S. PATENT DOCUMENTS

| | | | |
|---|---|---|---|
| 6,078,195 A | 6/2000 | Chen | |
| 6,090,153 A | 7/2000 | Chen et al. | |
| 6,369,606 B1 * | 4/2002 | Houghton et al. | 326/36 |
| 6,380,764 B1 | 4/2002 | Katho et al. | |
| 6,668,358 B2 | 12/2003 | Friend et al. | |
| 6,745,371 B2 | 6/2004 | Konstadinidis et al. | |
| 6,750,680 B2 | 6/2004 | Zama et al. | |
| 2002/0079927 A1 | 6/2002 | Katoh et al. | |
| 2004/0230924 A1 | 11/2004 | Williams et al. | |
| 2004/0243946 A1 | 12/2004 | Gandhi | |

OTHER PUBLICATIONS

Wei et al. "Mixed-Vth (MVT) CMOS Circuit Design Methodology for Low Power Applications," ACM, 1999, pp. 430-435.*
Anis et al., "Design ADN Optimization of Multi-Threshold CMOS (MTCMOS) Circuits," IEEE, May 2003, pp. 1-19.*
Terry Coughlin, Method, Circuit Library and Computer Program Product for Implementing Enhanced Performance and Reduced Leakage Current for ASIC Designs, U.S. Appl. No. 10/760,502, filed Jan. 20, 2004.

* cited by examiner

*Primary Examiner*—Vuthe Siek
(74) *Attorney, Agent, or Firm*—Sawyer Law Group LLP

(57) ABSTRACT

The present invention provides a system and method for providing a standard cell library for reduced leakage and improved performance. The standard cell library comprises at least two sets of threshold voltage cells. At least one of the sets includes non-mixed threshold voltage cells. At least one of the sets includes mixed threshold voltage cells. The mixed threshold voltage cells have at least one threshold voltage cell having a first threshold voltage and a second threshold voltage cell having a second threshold voltage. The first and second threshold voltages are different. The mixed threshold voltage cells have substantially the same footprint as the non-mixed threshold voltage cell.

3 Claims, 7 Drawing Sheets

Groundrule Illustration

Figure 2: Groundrule Illustration

|  |  | Transition Affected | Leakage Scalar L1, L2 | Performance Improvement |
|---|---|---|---|---|
| SU + some Launch | MPH0001_SU_RLRR_E | both | 16x, 4x | Setup time: 30%(R), 39%(F) |
|  |  |  |  | B to L2 Output: 11%(R), 16%(F) |
| SU + Launch | MPH0001_SU_RLLR_E | Output Rising | 16x, 16x | Setup time: 30%(R), 39%(F) |
|  |  |  |  | B to L2 Output: 31%(R), 6%(F) |
| SU + Launch | MPH0001_SU_RLLR_E | Output Falling | 16x, 16x | Setup time: 30%(R), 39%(F) |
|  |  |  |  | B to L2 Output: 12%(R), 29%(F) |
| SU + Launch | MPH0001_SU_LLLL_E | all | 16x, 28x | Setup time: 30%(R), 39%(F) |
|  |  |  |  | B to L2 Output: 31%(R), 29%(F) |
| SU Only | MPH0001_SU_E | Both input | 16x, 0x | Setup time: 30%(R), 39%(F) |
| Launch Only (limited) | MPH0001_RLRR_E | Both | 0x, 4x | B to L2 Output: 11%(R), 16%(F) |

Figure 4

| MUX211_DP_E | DPP2 master_C thru F | Transition Affected | Leakage | Performance Improvement |
|---|---|---|---|---|
| | MUX211_DP_RL | Falling | 14x | 26%(F) |
| | MUX211_DP_LR | Rising | 18x | 21%(R) |
| | MUX211_DP_LL | Both | 31x | 21%(R), 24%(F) |
| | | | | |
| MUX21_DP_H | DPP2: _E, _F, H | Transition Affected | Leakage | Performance Improvement |
| | MUX21_DP_LLRR | Both | 9x | 15%(R), 14%(F) |
| | MUX21_DP_LRRL | Falling | 15x | 27%(F) |
| | MUX21_DP_RLLR | Rising | 22x | 33%(R) |
| | MUX21_DP_LLLL | Both | 36x | 31%(R), 26%(F) |

Figure 5

| | | Transition Affected | Leakage Scalar | Performance Improvement |
|---|---|---|---|---|
| MUX41_D | SD1 (secondary decode options) | | | |
| | MUX41_RRRR,LL,LL,RRLL<br>This very nearly matches the all Lvt perf for SD1 launch | SD1 Falling: | 16x | 28%(R),<br>30%(F) |
| | | SD1 Rising: | | 32%(R),<br>35%(F) |
| | | SD2 Falling: | | 16%(R),<br>21%(F) |
| | | SD2 Rising: | | 20%(R),<br>18%(F) |
| | MUX41_RRRR,(RL)(LR)LR,RRLL<br>This nearly matches the all Lvt perf for SD1 launch | SD1 Falling: | 12x | 28%(R),<br>26%(F) |
| | | SD1 Rising: | | 20%(R),<br>23%(F) |
| | | SD2 Falling: | | 16%(R),<br>18%(F) |
| | | SD2 Rising: | | 19%(R),<br>17%(F) |
| | | | | |
| MUX41_D | SD2 (primary decode optimize) | | | |
| | MUX41_RRRR,LL,RR,LLLL<br>This nearly matches the all Lvt perf for SD2 launch | SD1 Falling: | 17x | 22%(R),<br>28%(F) |
| | | SD1 Rising: | | 31%(R),<br>27%(F) |
| | | SD2 Falling: | | 24%(R),<br>21%(F) |
| | | SD2 Rising: | | 19%(R),<br>27%(F) |

Figure 6

|  |  | Transition Affected | Leakage | Performance Improvement |
|---|---|---|---|---|
| NAND2_C | NAND2_LR | Rising | 26x | 27% |
|  | NAND2_RL | Falling | 16x | 37% |
|  | NAND2_LL | Both | 40x | 26%(R), 35%(F) |
|  | NAND2_ALR | Rising A Input only | 14x | 27% |
| NAND2_E | NAND2_R1L | Falling | 10x | 21% |
|  | NAND2_L1L | Both | 27x | 32%(R), 20%(F) |
|  | NAND2_LR | Rising | 21x | 27% |

Figure 7

SYSTEM AND METHOD FOR CREATING A STANDARD CELL LIBRARY FOR REDUCED LEAKAGE AND IMPROVED PERFORMANCE

FIELD OF THE INVENTION

The present invention relates to standard cell libraries, and more particularly to a system and method for creating a standard cell library for reduced leakage and improved performance.

BACKGROUND OF THE INVENTION

Generally, circuit designs start out using the lowest leakage devices available that can satisfy the desired performance. Then, after making device size adjustments through drive strength choice and cell place and route optimizations, it may be necessary to use devices with a lower threshold voltage. Devices with a lower threshold voltage have an increased amount of leakage current, but until recently the increase has not been prohibitive. In 180 nm and 130 nm generations of silicon technology, devices had a leakage current of 10:1 for low threshold voltage devices to regular threshold voltage devices. However, with 90 nm technology, the ratio may be at as high as 40:1.

Standard cell libraries offer a variety of functions with varying drive strengths for each function. However, with the increased ratio of leakage current between low and regular threshold voltage devices, the usefulness of current standard cell libraries in circuit design has decreased. Accordingly, what is needed is system and method for creating a standard cell library for reduced leakage and improved performance. The present invention addresses such a need.

BRIEF SUMMARY OF THE INVENTION

The present invention provides a system and method for providing a standard cell library for reduced leakage and improved performance. The standard cell library comprises at least two sets of threshold voltage cells. At least one of the sets includes non-mixed threshold voltage cells. At least one of the sets includes mixed threshold voltage cells. The mixed threshold voltage cells have at least one threshold voltage cell having a first threshold voltage and a second threshold voltage cell having a second threshold voltage. The first and second threshold voltages are different. The mixed threshold voltage cells have substantially the same footprint as the non-mixed threshold voltage cell.

According to a method and system disclosed herein, the present invention provides cells, in one embodiment for a standard cell library, that improve performance over regular threshold voltage cells, without as high overall leakage current as in low threshold voltage cells. The cells in the standard cell library include both a low and a regular threshold voltage device. The low threshold voltage device improves performance while the regular threshold voltage device keeps down leakage current, depending on where they are placed within the cell and how they are used. For example, with respect to an inverter, rising performance may be improved in one cell, while in another cell falling performance may be improved, depending on how the devices within the cell are configured.

BRIEF DESCRIPTION OF SEVERAL VIEWS OF THE DRAWINGS

FIG. 4 is a table illustrating MPH style latch results for one embodiment of the invention.

FIG. 5 is a table illustrating data-path multiplexer results for one embodiment of the invention.

FIG. 6 is a table illustrating control path multiplexer results for one embodiment of the invention.

FIG. 7 is a table illustrating NAND2 results for one embodiment of the invention.

DETAILED DESCRIPTION OF THE INVENTION

The present invention relates to standard cell libraries, and more particularly to a system and method for creating a standard cell library for reduced leakage and improved performance. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

A standard cell library according to the invention includes a set of cells offering a mix of threshold types tuned for improved performance, while offering lower leakage than the low threshold voltage cell and having the same footprint as the regular threshold voltage cell of the same function. The cells offering a mix of threshold types are also called mixed threshold voltage cells. The devices in the cells may be field-effect transistors (FET), for example, and may be connected together to perform various functions. A typical library will have many cells. In this standard cell library, also called a hybrid library, there may be several different cells that perform the same function and have the same footprint. Having the same footprint means the mixed threshold voltage cell occupies the same area as a non-mixed threshold voltage cell (either a low voltage threshold cell, regular voltage threshold cell or a high voltage threshold cell) of the same function, without altering the pins or blockage of the regular threshold voltage cell.

Figure 1:
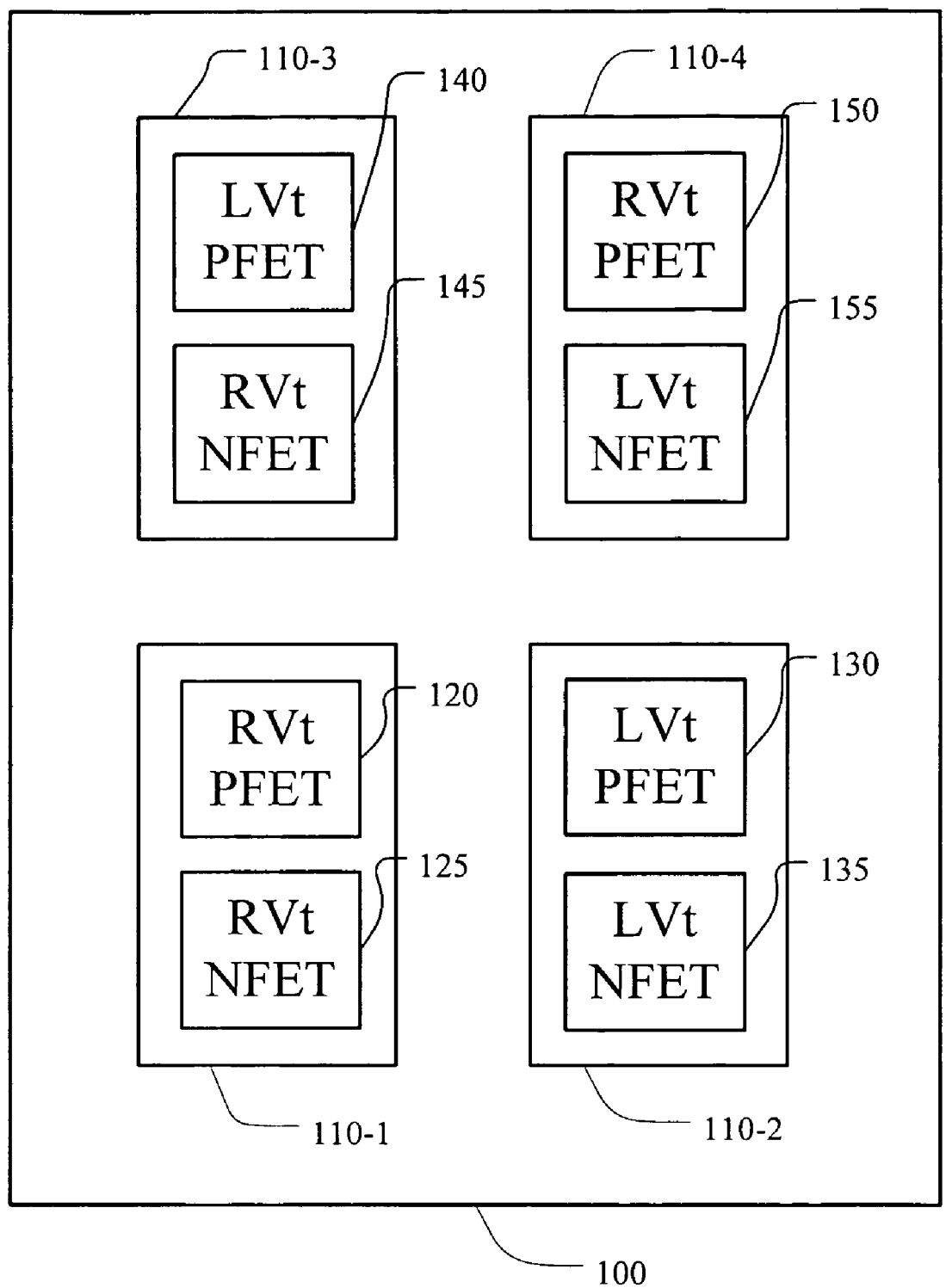
FIG. 1 is a diagram of one embodiment of the invention illustrating a standard cell library.

The number of devices in a cell will vary depending on the device function. Following, with FIG. 1, is one example of a standard cell library including cells for the inverter function. Many other functions may be encompassed by the invention, some of which are discussed below. Cells directed towards other functions may have fewer devices or, more likely, more devices than cells for the inverter function. Any configuration of devices is possible.

FIG. 1 is a diagram of one embodiment of the invention illustrating a standard cell library 100. The standard cell library includes cells 110-1, 110-2, 110-3 and 110-4 (collectively referred to as cells 110). The standard cell library 100 typically includes more than four cells 110, but for simplicity this embodiment is limited to four. The standard cell library 100 does not represent a working device, rather it is a set of cells 110 offering a mix of threshold voltage cells for circuit design, the standard cell library 100 including the cells 110 for improved performance. Depending on the needs of a designer, different cells 110 may be used for different functions and different requirements (leakage, performance, size, etc.).

A conventional inverter comes in a low threshold voltage cell and a regular threshold voltage cell, referred to collectively as non-mixed threshold voltage cells. For example cell 110-1 is a regular threshold voltage and cell 110-2 is a low threshold voltage. Cell 110-1 includes regular threshold voltage devices 120 and 125, which are, in the case of an inverter, a P field-effect transistor (FET) and a NFET, respectively. Cell 110-1 may represent a regular threshold voltage cell in a base configuration, with standard leakage and performance. Cell 110-2 includes low threshold voltage devices 130 and 135, which may also be, for an inverter, a PFET and a NFET, respectively. Cell 110-2 may represent a low threshold voltage cell in a base configuration, with improved performance but up to 40 times the leakage of cell 110-1.

In addition to the regular and low threshold voltage cells 110-1 and 110-2, cells 110-3 and 110-4 include devices with differing threshold voltages, referred to collectively as mixed threshold voltage cells. The cell 110-3 includes a low threshold voltage device 140 and a regular threshold voltage device 145, which may also be, for an inverter, a PFET and a NFET, respectively. The cell 110-3 represents a mixed threshold voltage cell with improved rising performance over cell the 110-1, and less leakage than the cell 110-2. A designer may use the cell 110-3 when the timing of the rising transition is more important than the timing of the falling transition. So if the timing for an inverter on the rising transition is more critical or difficult to meet, a designer may use the cell 110-3, which is tuned for better rising performance while achieving significantly less leakage.

A cell 110-4 may include a low threshold voltage device 155 and a regular threshold voltage device 150, which may also be, for example in an inverter, a NFET and a PFET, respectively. The cell 110-4 represents a mixed threshold voltage cell with improved falling performance over the cell 110-1, and less leakage than cell the 110-2. A designer may use the cell 110-4 when the timing of the falling transition is more important than the timing of the rising transition. So if the timing for an inverter on the falling transition is more critical or difficult to meet, a designer may use the cell 110-4, which is tuned for better falling performance while achieving significantly less leakage.

With respect to the inverter function, the reason tuning the cells 110-3 and 110-4 works is because one device (FET) is typically on while the other is off. If the cell 110-1 with regular threshold voltage devices has a current leakage of 1×, and the cell 110-2 with low threshold voltage devices has a current leakage of 40×, then the leakage for cells 110-3 and 110-4 with mixed threshold voltages may be calculated by multiplying the width of whichever device is off by the individual device leakage current scalar, then averaging all states (assigning equal probability of state). This may then be compared to regular threshold voltage cells and normalized. Continuing with the example of the inverter from above, having Wp being 2× Wn (where Wp is the width of the PFET transistor and Wn is the width of the NFET transistor), then the leakage current of cell 110-3 is 27 times the leakage current of cell 110-1, and the leakage current of cell 110-4 is 14 times the leakage current of cell 110-1. Also, rising performance of cell 110-3 is approximately 25% faster than that of cell 110-1 (with regular threshold voltage devices), and even 2% faster than that of cell 110-2 (with low threshold voltage devices), while only increasing leakage by 27×, rather than 40×. On the other hand, falling performance of the cell 110-2 is likely to be better than that of the cell 110-3.

Falling transition delay of cell 110-4 is approximately 33% faster than that of cell 110-1 (with regular threshold voltage devices), and even 2% faster than that of cell 110-2 (with low threshold voltage devices), while only increasing leakage by 14×, rather than 40×. Likewise, rising performance is likely to be better with the cell 110-2 over the cell 110-4.

While the above embodiment and example is directed toward an inverter function, the invention is applicable towards any and all device functions, for example buffers, NAND2, NAND3, other stacked devices, latches, multiplexors, XOR, XNOR. One of ordinary skill in the art will recognize that cells 110 for different functions will have different devices and different numbers of devices in them. In one embodiment, unbuffered input pass gates (transmission gate devices) are prohibited from being low threshold voltage devices for leakage reasons. In another embodiment, unbuffered data input pass gates (transmission gate devices), in multiplexor hold (MPH) style latches, do act as low threshold voltage devices. In another embodiment, using a device with low threshold voltage front-end and a regular threshold voltage output stage may result in performance improvements for both transitions while minimizing the overall leakage delta. Furthermore, threshold voltage devices with different Vt can be coupled in parallel to emulate an alternate Vt type, that is a Vt that is somewhere between the two or more threshold types employed. In still another case, cells having more than 2 unique threshold types can be crafted to further optimize the leakage power/performance using the teachings of this patent.

Figure 2:
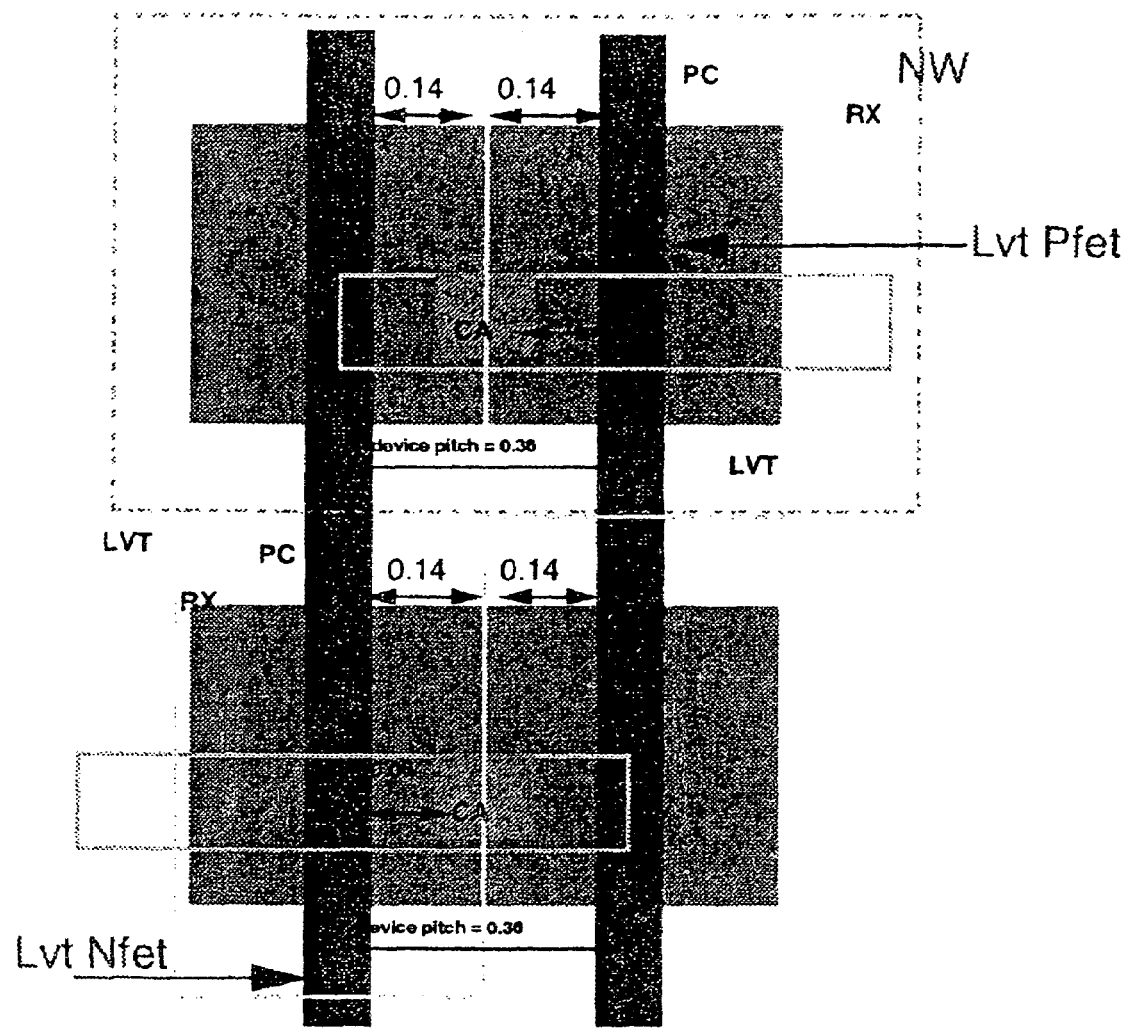
FIG. 2 is a block diagram of a ground rule illustration to support a hybrid threshold voltage standard cell library having a common physical footprint.

FIG. 2 is a block diagram of a layout ground rule illustration to support a hybrid threshold voltage standard cell library having a common physical footprint. In FIG. 2, the space between the two vertical poly lines must be capable of supporting a diffusion contact, CA, at the common junction. The space must also be capable of supporting the implant layer, LVT, overlap of the device region as well as the implant space to unlike implanted device. We refer to the distance from the center of one device to the center of the adjacent device sharing a common diffusion contact, as the contacted device pitch. In this figure it can be seen that the right most pfet device and left most nfet device are being defined as a LVt type by the presence of the LVt implant mask shapes. The left most pfet and right most nfets are RVt devices defined by the absence of any additional implant mask shapes. Proper lithographic tooling can support ground rules such that there is no area (density) penalty associated with a contacted device pitch matching a contacting device pitch allowing dissimilar implant types.

In order to maintain a mixed, or hybrid threshold voltage standard cell library having a common physical footprint (meaning the mixed threshold voltage cell occupies the same area as the regular threshold voltage cell of the same function, and without altering the pins or blockage of the regular threshold voltage cell), some guidelines may be established. The implant overlap of the gate dielectric (tox) and space to unlike device (meaning regular threshold voltage device to low threshold voltage device or generically, one implant type device to another device of unlike type) layout ground rules should match the contacted device space. The contacted device space is the distance between two device poly edges sharing a common contacted diffusion.

Device spacing rules between like devices (e.g. a regular threshold voltage device adjacent to a regular threshold voltage device), should be kept as small as possible. DUV implanters may help to address spacing. A circuit with any implant may be placed next to any other implanted circuit type, so the boundary conditions, that is the boundary or perimeter of one cell relative to the boundary of another cell, must account for any and all ground rules when the composite placements are made. This may include the need to reduce the maximum transistor size by some small amount relative to a transistor in a regular threshold voltage cell in order to avoid placement issues where the implant to implant spacing issues can be violated.

Cell physical design methodology may use parameterized cells, supporting device width, cell pitch, power/ground bus width and power bus offset. N well and substrate contact conditional inclusions are also available. In one embodiment, the present invention is implemented within the CADENCE DESIGN SYSTEM and includes lower threshold voltage implant conditional inclusion on a device-by-device basis. In addition, for multiple devices configured in parallel, an option exists for partial device conditional implant allowing a tailoring of device implant voltage threshold. Stretch lines may be integrated within the cell to ensure that the implant border tracks the device as its size changes. This parameterization approach allows a single layout master to support a variety of implants on an individual device basis to be readily generated, thereby supporting the automation of a power/performance tuned library.

As mentioned above, other device functions may be implemented with the present invention. With respect to other embodiments (device functions), the following naming convention is used in order to avoid confusion while discussing many cells having the same function and drive strength, but having different implant configurations. 'L' and 'R' denote implant types, specifically 'low' and 'regular,' respectively.

One of ordinary skill recognizes that multiple implant types could be utilized and their use would be within the spirit and scope of the present invention. For example, 'H' could be employed to denote a 'high' Vt implant option that could be utilized in conjunction with an L and/or R implant type in a standard cell library.

The implants are ordered by listing PFET followed by NFET from input to output. In one example, a conventional regular threshold voltage buffer may be named Buffer_F. In a configuration where the predrive inverter to the buffer is low threshold voltage and the output stage is regular threshold voltage, the buffer is named Buffer_LLRR_F. The implant characters (L and R) are appended to the function name and preceded by an underscore to represent the threshold voltage configuration. Simpler circuits, like the inverter, can use two characters, with the first representing the implant type of the PFET and the second representing the implant type of the NFET. The following list includes some inverters:

| | |
|---|---|
| Invert_LR_E_9 | 9-channel, E-pwr, inverter L PFET & R NFET |
| Invert_LR_E | 12-channel, E-pwr, inverter L PFET & R NFET |
| Invert_LL_E | 12-channel, E-pwr, inverter L PFET & L NFET |
| Invert_E | 12-channel, E-pwr, inverter R PFET & R NFET |

In the last example, the absence of additional characters is the default, or regular threshold voltage cell. The 9-, 12-channel reference above is the cell pitch or height moniker. The default in this example is 12.

In another embodiment, gradient-based threshold voltages may be used. In this case, the gradient may have a given percentage of the total device width to be low threshold voltage with the remaining width at regular threshold voltage. In a high drive strength device, the convention would look like:

| | |
|---|---|
| Invert_H5LR_S | 12-channel, S-power, inverter gradient based PFET wherein 5 of the PFETs are low threshold voltage and all the NFETs are regular threshold voltage |

For more complex random logic circuits, a four-character set should be sufficient to describe all mixed threshold cells. The first set may describe the predrive if any while the second set describes output devices. For example:

| | |
|---|---|
| Buffer_LRRL_E | 12-channel, E-power buffer, L PFET & R NFET inverter predrive, R PFET & L NFET inverting output stage |
| Buffer_RLLR_E | 12-channel, E-power buffer, R PFET & L NFET inverter predrive, L PFET & R NFET inverting output stage |

In another embodiment, a low threshold voltage front-end and a regular threshold voltage output stage may be used. This configuration should result in performance improvements for both transitions (rising and falling) while minimizing the overall leakage delta. In this embodiment, the naming convention for an F-power code (drive strength) AND gate would be: AND2_LLRR_F.

In another embodiment, a naming convention for conditional inclusion across cells may be applied. In this embodiment, all conditional low threshold voltage parameters are defaulted to be false to result in a regular threshold voltage implementation. All conditional parameters may begin with low threshold voltage followed by device type (NFET, PFET), device name, and a question mark (?). Some generalizations include:

LvtPZ? and LvtNZ? are used to describe the conditional inclusion of the output PFET and NFET devices respectively, for all random logic circuits;

LvtP? and LvtN? are used to describe the conditional inclusion of the predrive P and N devices respectively, for two-stage random logic circuits such as AND, OR, and Buffer.

To describe the purpose of this naming convention using a specific device refer now to the following discussion in conjunction with the accompanying figure. A multiplexor hold (MPH) latch is a multiplexed polarity hold latch. The MPH latch multiplexes the functional data and the LSSD scan input data together by means of a pair of transmission gates which are controlled by a test enable signal. The normal mode is test enable disabled thereby allowing functional data to be selected.

Figure 3:
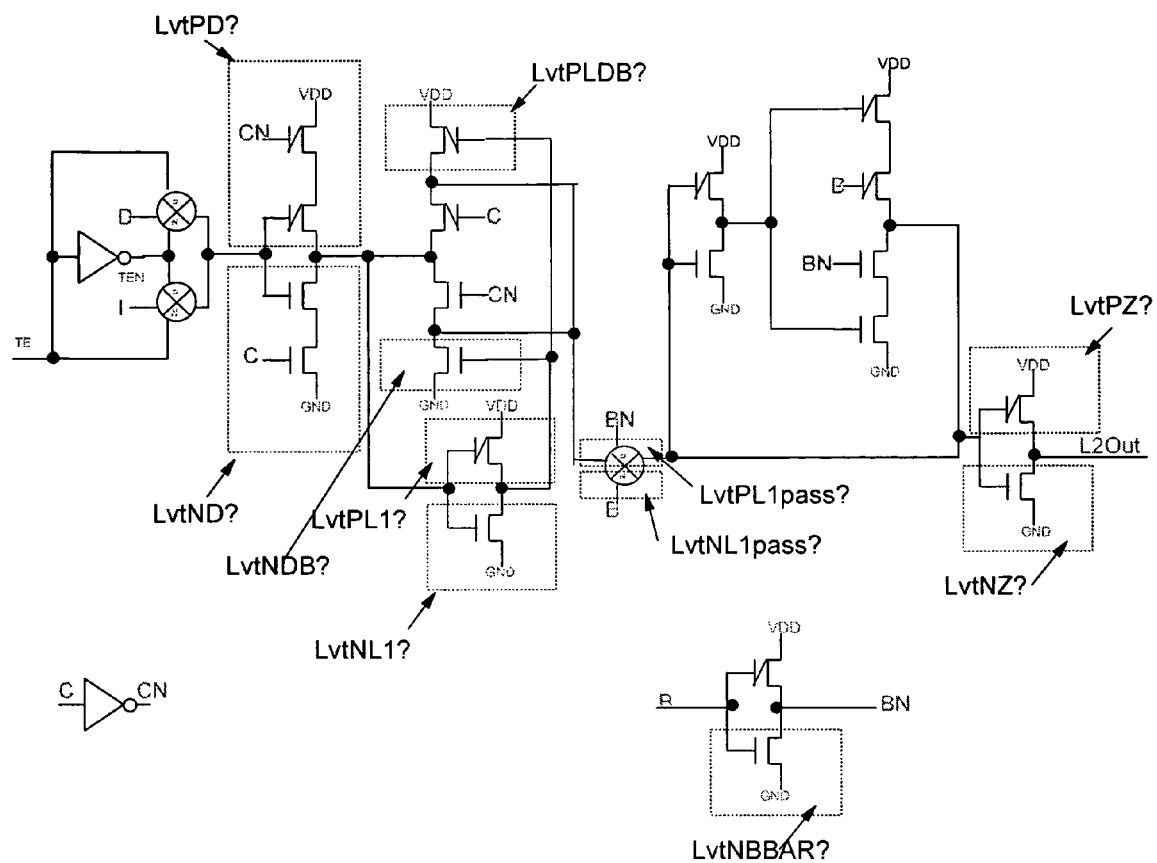
FIG. 3 illustrates a MPH L1/L2 latch with illustrative parameters in accordance with the present invention.

FIG. 3 which is a MPH L1/L2 latch with illustrative implant parameters will be used for the following discussion.

With the conditional inclusions, for a multiplexor hold (MPH) L1 latch, LvtPDPASS? and LvtNDPASS? are the PFET and NFET pass gates associated with the data input to the MPH L1, which are defaulted to low threshold voltage for best performance and no leakage delta.

The conventions LvtPD? and LvtND? are the devices associated with the four-device clocked stack of the L1. LvtPL1? and LvtNL1? are the devices associated with the L1 feedback inverter (drives the L2 in the MPHL1). LvtPDB? and LvtNDB? are the devices associated with the inverter used to drive the L2 in the MPHL1C. LvtPL1Z? and LvtNL1Z? are the L1 output inverter devices, if any.

For the MPHL2 latch, conditional inclusions, the LvtPL1pass? and LvtNL1pass? are the PFET and NFET pass gates associated with the L2 data input (L1 to L2). LvtPoutpredrv? and LvtNL1pass? are the devices associated with the L2 output predriver, if any. LvtNBBAR? is the NFET device in the B-clock complement inverter. LvtPZ? and LvtNZ? are the L2 output devices.

The following observations may assist in building a standard cell library according to the invention. The leakage current is a function of device stacking and the applied bias to each device in the stack. A single NFET between the output and ground has a leakage factor of 1 when its gate is at "0."

A series stack of 2 NFET devices has a leakage factor of 1 when the bottom device's gate is connected to Vdd and the top device's gate is at "0." The leakage factor is at 0.75 when the bottom device's gate is connected to "0" and the top device's gate is at Vdd due to the lower Vds=(Vdd−Vt). The leakage factor is 0.13 when the gates of both devices are connected to "0." PFETs behave in a similar manner.

Performance degradation of non-low threshold voltage transitions is typically 1-2%. The degradation can range to 5% for stacked configurations like AOI and OAI. The degradation can be mitigated or reduced by selective implant on non-balanced configurations.

With respect to an L2 latch pass gate, using a low threshold voltage NFET within the transmission gate pair (LvtNL1pass? of FIG. 3) of the L2 may result in (relative to the B-clk activation and assuming an early setup to L1), an 11% overall output rising performance improvement (rising dominates overall delay). Also, there is a 6% overall output falling performance improvement and very low IDDq delta due to the state dependence of the L1 and L2.

Using a low threshold voltage PFET (LvtPL1pass? of FIG. 3) in conjunction with a low threshold voltage NFET within the transmission gate pair of the L2 may result in (relative to the B-clk activation and assuming early setup to L1) little additional performance improvement relative to B-clk activation, and additional IDDq leakage (6× total) for little B-clk launch improvement, but improved flush delay.

Taking into account the above observations and naming conventions, several embodiments of the invention are next described. FIG. 4 is a table illustrating MPH style latch results for one embodiment of the invention. The L1 setup for an MPH style latch may be improved by having the implant specification for optimized setup (SU) equal LL,LL, LL,RR, the order referring to L1 data n/p pass gate, 4 device stack, inverter, FeedBack inverter (L2 in). If SU is not specified, all L1 devices except the data input transmission date pair are regular threshold voltage.

The L2 launch may be improved by keeping all devices as regular threshold voltage unless otherwise stated. From a nomenclature perspective, the first pair is equal to L2 pn transmission gate pair (pn) and the second pair is equal to an L2 output inverter. See FIG. 4 for more detail on specific configurations, transition affected, relative leakage, and performance improvement.

FIG. 5 is a table illustrating data-path multiplexor results for one embodiment of the invention. Data-path multiplexors (mux) use non-buffered transmission gate pairs on all inputs. In this embodiment, none of these inputs is a low threshold voltage. FIG. 5 illustrates performance improvement and leakage current for both the inverting and non-inverting 2:1 data-path mux (4:1 muxes behave in a similar manner). The inverting multiplexor has an inverter as its output stage and the non-inverting multiplexor has a buffer. From the nomenclature described above, the implant specifications for these muxes will follow that of the inverter and buffer.

FIG. 6 is a table illustrating control path multiplexor results for one embodiment of the invention. Control path muxes are designed to provide the quickest response to a late arriving control situation. In the case of a 4:1 mux, the architecture is that of a 2:1 mux feeding a secondary 2:1 mux. The primary mux is comprised of a four-device stack, and the secondary is a transmission gate type. The decode for the 4:1 mux is that of two simple inverters. FIG. 6 illustrates the performance improvement and leakage current for a non-inverting 4:1 control-path mux.

FIG. 7 is a table illustrating NAND2 results for one embodiment of the invention. The configuration for NAND2_ALR includes a low threshold voltage PFET only on the A-input. This configuration provides improved rising response on one of the two inputs while preserving leakage power.

Several different embodiments according to the present invention have been disclosed. Accordingly, a standard cell library is disclosed that supports a threshold voltage choice on an individual device or select device basis. A standard cell library is disclosed that has the same physical footprint (size and pin placement) for each cell within the logical class and device size regardless of the Vt intermix. A standard cell library is disclosed that can be tuned for individual transitions through the use of a Vt intermix of devices. A standard cell library is disclosed which supports a broad transition based response as a function of optimized leakage. A standard cell library is disclosed that allows devices placed on a contacted pitch to be selectable for any Vt implant. A standard cell library is disclosed that emulates an alternate Vt type by mixing Vt's of parallel devices. Finally, a standard cell library is disclosed that rapidly crafts said library by activation of programmable constructs by means of conditional inclusion statements to choose the desired Vt implant and stretch lines to ensure proper ground rule coverage/borders of the device. The performance improvements are generally transition based, sometimes matching the low threshold voltage counterpart but having reduced leakage power. Many more circuit configurations are possible.

According to the method and system disclosed herein, the present invention provides a system and method for creating a standard cell library for reduced leakage and improved performance. The standard cell library of the present invention offers a footprint-compatible set of circuits with comparable performance on a transition basis, while consuming less overall leakage power when compared to the all low threshold voltage version. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

I claim:

1. A standard cell library for reduced leakage and improved performance comprising:
   a non-mixed threshold voltage cell; and
   a mixed threshold voltage cell having a footprint no larger than a footprint of the non-mixed threshold voltage cell, the mixed threshold voltage cell including a first threshold voltage device and a second threshold voltage device, the first threshold voltage device having a different threshold voltage relative to the second threshold voltage device,
   wherein an implant overlay of tox and space between first threshold voltage device and the second voltage threshold voltage device matches a minimum contacted space between the first threshold voltage device and the second voltage threshold voltage device so that the footprint of the mixed threshold voltage cell is no larger than the footprint of the non-mixed threshold voltage cell.

2. A method for creating a standard cell library for reduced leakage and improved performance, the method comprising:
   providing a mixed threshold voltage cell having a footprint no larger than a footprint of a non-mixed threshold voltage cell in the standard cell library, the mixed threshold voltage cell including a first threshold voltage device and a second threshold voltage device, the first threshold voltage device having a different threshold voltage relative to the second threshold voltage device,
   wherein an implant overlay of tox and space between first threshold voltage device and the second voltage threshold voltage device matches a minimum contacted space between the first threshold voltage device and the second voltage threshold voltage device so that the footprint of the mixed threshold voltage cell is no larger than the footprint of the non-mixed threshold voltage cell.

3. A standard cell library comprising:
   a plurality of voltage cells, wherein:
      a first set of the plurality of voltage cells includes non-mixed threshold voltage cells; and
      a second set of the plurality of voltage cells includes mixed threshold voltage cells, each of the mixed threshold voltage cells having a first device and a second device that have different threshold voltages,
   wherein an implant overlay of tox and space between the first device and the second device matches a minimum contacted space between the first device and the second device to provide an identical footprint for the mixed threshold voltage cells as for a footprint of the non-mixed threshold voltage cells, and
   wherein the mixed voltage threshold cells have a same function as the non-mixed threshold voltage cells, and a first ground rule for the first device is less than or equal to a second pound rule for the second device.

* * * * *